United States Patent [19]

Paoli

[11] Patent Number: 5,228,049
[45] Date of Patent: Jul. 13, 1993

[54] BEAM CONTROL IN INTEGRATED DIODE LASER AND POWER AMPLIFIER

[75] Inventor: Thomas L. Paoli, Los Altos, Calif.
[73] Assignee: Xerox Corporation, Stamford, Conn.
[21] Appl. No.: 750,382
[22] Filed: Aug. 27, 1991
[51] Int. Cl.[5] ............................................. H01S 3/19
[52] U.S. Cl. ....................................... 372/50; 372/44; 372/46
[58] Field of Search ............................ 372/50, 44, 46

[56] References Cited

U.S. PATENT DOCUMENTS

| | | |
|---|---|---|
| 4,744,089 | 5/1988 | Montroll et al. |
| 4,780,879 | 10/1988 | Chinone et al. |
| 4,791,646 | 12/1988 | Lindsey et al. |
| 4,878,724 | 11/1989 | Thaniyavarn |
| 4,980,893 | 12/1990 | Thornton et al. ............... 372/50 |
| 5,003,550 | 3/1991 | Welch et al. |

FOREIGN PATENT DOCUMENTS

| | | |
|---|---|---|
| 0366135 | 10/1989 | European Pat. Off. |
| 92306943 | 11/1992 | European Pat. Off. |

OTHER PUBLICATIONS

Bendelli, G., et al., "A New Structure for High-Power TW-SLA," *IEEE Photonics Technol. Lett.* 3:42–44 (1991).

Andrews, J. R., "Traveling-Wave Amplifier Made from a Laser Diode Array," *Appl. Phys. Lett.* 48:1331–1333 (1986).

Koren, U., et al., "Wavelength Division Multiplexing Light Source With Integrated Quantum Well Tunable Lasers and Optical Amplifiers," *Appl. Phys. Lett.* 54:2056–2058 (1986).

Macomber, S. H., et al., "Semiconductor Laser Power Amplifier," *SPIE Progress in Semiconductor Laser Diodes* 723:36–39 (1986).

Welch, D. F., et al., "High Power, AlGaAs Buried Heterostructure Lasers with Flared Waveguides," *Appl. Phys. Lett.* 50:233–235 (1987).

Stephens, R. R., et al., "Phase Conjugate Master Oscillator-Power Amplifier Using BaTiO$_3$ and AlGaAs Semiconductor Diode Lasers," *Appl. Phys. Lett.* 50:647–649 (1987).

Lindsey, C., et al., "Tailored-Gain Broad-Area Semiconductor Laser with Single-Lobed Diffraction-Limited Far-Field Pattern," *Electronics Letters* (1st Aug. 1985) vol. 21, No. 16, pp. 671–673.

*Primary Examiner*—Akm E. Ullah
*Assistant Examiner*—Robert E. Wise
*Attorney, Agent, or Firm*—Townsend and Townsend Khourie and Crew

[57] ABSTRACT

A semiconductor laser having a plurality of heterostructure layers including at least one active layer for production and amplification of coherent radiation includes an integrated amplifier part. The amplifier part includes a contact set and a mask layer to shape a lateral gain profile, through control of injected carriers, in the active region of the amplifier part. The shaped lateral gain profile matches the amplitude maxima and minima of a fundamental mode of the semiconductor laser, which reduces modal distortion and improves efficiency. The contact of the integrated amplifier is also shaped to match a width of an expanding laser beam from the laser part into and through the amplifier part. Additionally, various lenses integrated onto an output of the amplifier part can effect collimation or magnification/focussing. In one embodiment, the integrated lens part includes a separately addressable and controllable contact to dynamically control a focal length of the integrated lens. This electronically controllable lens permits spot size modulation and dynamic correction of focussing errors.

29 Claims, 5 Drawing Sheets

BEAM CONTROL IN INTEGRATED DIODE LASER AND POWER AMPLIFIER

BACKGROUND OF THE INVENTION

This invention relates to semiconductor lasers and more specifically it relates to an integration of a diode laser with a traveling-wave semiconductor optical amplifier wherein the amplifier has a gain profile spatially shaped to improve output beam control and it incorporates an integrated lens at its output.

Conventional semiconductor lasers emit coherent radiation having particularized transverse electric (TE) modal characteristics. For many applications, the emitted coherent radiation is unsatisfactory because it does not offer sufficient power to meet minimum requirements. Typically, a mode designated as $TE_{0,0}$ provides greatest power and has other desirable attributes, therefore operation of semiconductor lasers to emit radiation having this fundamental mode is desirable. Increasing the power output of a semiconductor laser by more energetic pumping often results in an addition of unwanted higher order modes to the output beam of the laser. These unwanted modes limit the effectiveness of increasing output power in this fashion.

In response to a desire for greater power in the fundamental mode, semiconductor laser designers provide amplifiers coupled to the semiconductor laser output which boost the effective power output from the semiconductor laser. These amplifiers while effectively boosting output power, are not optimally efficient because of coupling losses. These amplifiers can also distort the fundamental mode output from the laser if any modal mismatch exists at the entrance to or in the gain of the amplifier section. Contributing to a difficulty of providing suitable amplifiers is a severity of the divergence of the laser beam.

SUMMARY OF THE INVENTION

The present invention provides a method and apparatus for improving beam control in an integrated semiconductor laser and power amplifier. The invention offers advantages over existing systems. Integration of the amplifier with the semiconductor laser improves efficiency of the amplifier section. Particular shaping of the amplifier section, especially a contact of the amplifier section, and a spatial tailoring of the gain profile of the amplifier section provides improved power performance and decreased levels of output beam modal distortion. Integration of a lens at an output of the amplifier section provides an ability to collimate or focus an output beam, and in one embodiment, the integrated lens has a controllably variable focal length.

According to one aspect of the invention, it includes a monolithic semiconductor structure divided into a laser part and an amplifier part. The laser part and the amplifier part have a plurality of semiconductor heterostructure layers disposed over a substrate. At least one layer of each part being an active region for light amplification and propagation under lasing conditions to produce an electromagnetic wave having a particular mode characterized by spatially distributed amplitude maximum and minima.

Two sets of contacts control operation of the integrated laser and amplifier part. A first contact set, coupling a first and a second surface of the laser part, receives a first voltage and facilitates application of a first electrical forward bias to the layers of the laser part causing the laser part to emit the electromagnetic wave having the particular mode. A second contact set, coupling a first and a second surface of the amplifier part, receives a second voltage and facilitates application of a second electrical forward bias to the layers of the amplifier part causing the active region of the amplifier part to produce a population inversion of a plurality of carriers which amplify the electromagnetic wave as it expands during propagation through the active region. In one preferred embodiment, the second contact set is shaped to match a divergent beam of the coherent radiation emitted from the laser part.

The preferred embodiment disposes a mask between one contact of the second contact set and the active region of the amplifier part. The mask tailors a spatial gain profile of the active region of the amplifier part to provide a non-uniform spatial distribution of the plurality of carriers in the active region. The non-uniform spatial distribution of the plurality of carriers result in variable densities, with the shaping of spatial distribution creating regions of highest densities corresponding to amplitude maxima of the particular mode of the electromagnetic wave. Lowest densities of the plurality of carriers correspond to amplitude minima of the particular desired mode of the electromagnetic wave.

Another aspect of the present invention includes a lens integrated at an output of the amplifier part. The lens will collimate the amplifier part output by placing the output plane of the amplifier part at a focal point of the lens. The lens will alternatively focus the beam to a magnified image of the laser output at a particular distance from the lens by appropriate shaping of the lens.

An additional aspect of the present invention provides an integrated lens part and amplifier part with separate contacts to the lens part. The additional contact controls the focal length of the lens. Electrical communication of different bias voltages controls a plurality of carriers injected into the lens part, which varies an index of refraction of the lens part. This varying index of refraction allows an image of the laser output, that is the amplifier input, to be focussed at an electronically controllable distance.

The present invention offers advantages over existing systems due to provision of a varied density of carriers within the amplifier part with the carrier density intensities matching characteristics of a particular mode of a beam of laser radiation. With regions having densest carriers corresponding to mode maxima and regions having sparsest carriers corresponding to mode minima, mode distortion is minimized and efficiency of the amplifier is increased. The integrated lens permits efficient collimation or focussing, while a electronically controllable focus length for the lens permits dynamic correction of an image distance as well as modulation of the focal spot size. The dynamic correction and the modulation would be useful in many printing applications.

Reference to the remaining portions of the specification and the drawings may realize a further understanding of the nature and advantages of the invention.

BRIEF DESCRIPTION OF THE DRAWINGS

FIG. 4A is a graph of a $TE_{0,0}$ fundamental wave of the type emitted by the active region 24 of the heterostructure 10 showing amplitude versus spatial position at a particular cross-sectional area of the amplifier part 10' having an upper contact 30' with a width $W_i$;

FIG. 4B is a graph, corresponding to the graph of FIG. 4A, illustrating a concentration of carriers in the active region 24 of the amplifier part 10' under the upper contact 30' versus spatial position for an amplifier part 10' without the mask layer 40; and FIG. 4C is a graph, corresponding to the graph of FIG. 4A, illustrating a concentration of carriers in active region 24 of the amplifier part 10' under the upper contact 30' versus a spatial position for the amplifier part 10' having the mask layer 40 according to the present invention;

DESCRIPTION OF SPECIFIC EMBODIMENTS

Figure 1:
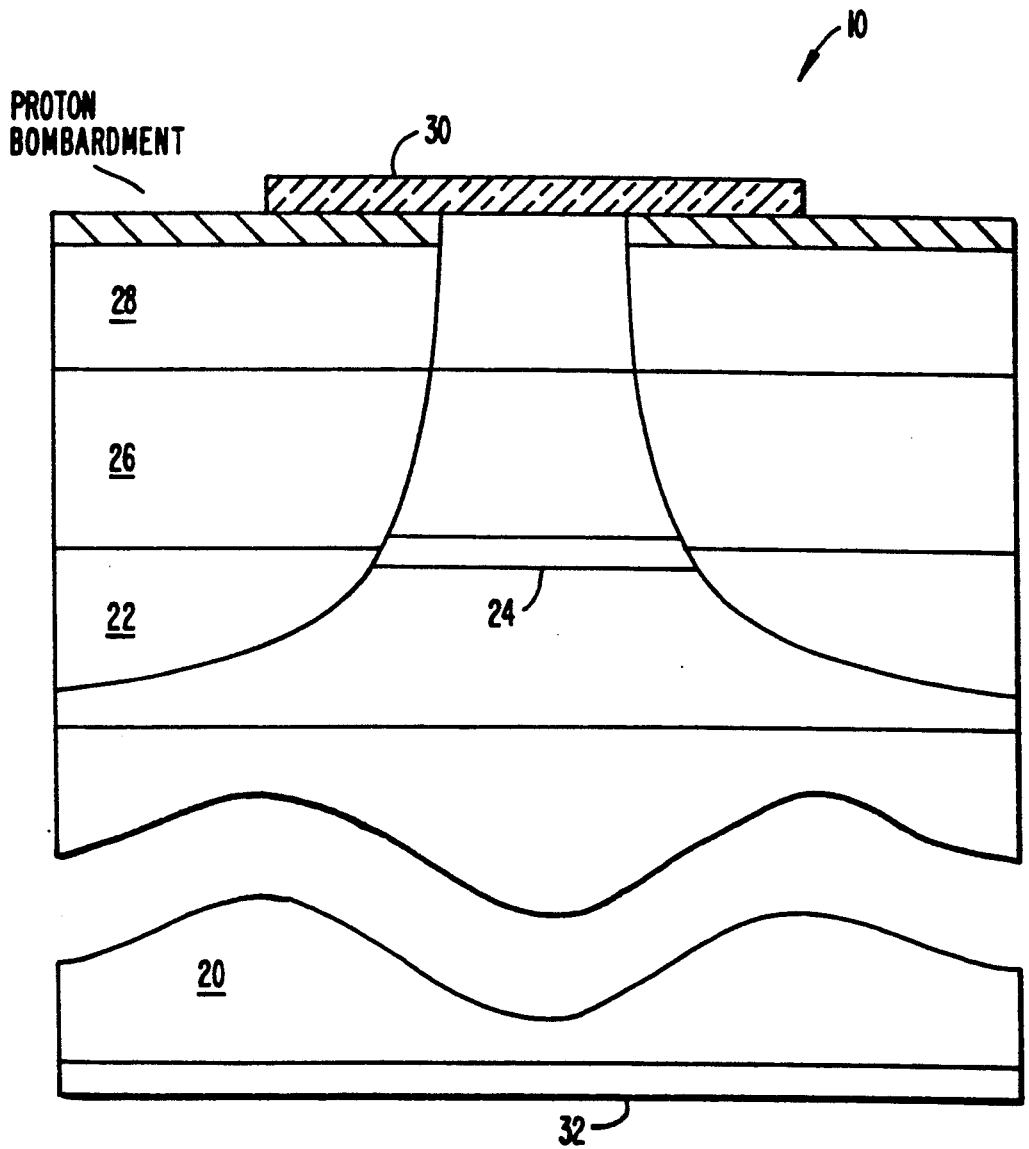
FIG. 1 is an enlarged view of a profile of a semiconductor heterostructure 10.

FIG. 1 is an enlarged view of a profile of a semiconductor heterostructure 10. The heterostructure 10 includes a plurality of epitaxially deposited layers 22-28 on a substrate 20. As one example of a semiconductor laser structure, the heterostructure 10 is fairly representative, but other laser semiconductor structures are possible for use with the present invention. In the preferred embodiment, the heterostructure 10 includes the substrate 20 made up of n-GaAs having consecutively deposited epitaxial layers 22-28. An MO-CVD reactor forms the epitaxial layers, as is known in the art. The epitaxial layers of the preferred embodiment include a first cladding layer 22, an active region 24, a second cladding layer 26, and a cap layer 28. A layer of $n\text{-}Ga_{1-y}Al_yAs$ with y varying between 0.4 and 0.8, preferably y equal about 0.40, makes up the first cladding layer 22, for example. A layer of any of GaAS, $Ga_{1-x}Al_xAs$, a single quantum well layer of GaAS, or a plurality of quantum well layers of alternating layers of either GaAs and $Ga_{1-x}Al_xAs$ or $Ga_{1-x}Al_xAs$ and $Ga_{1-z}Al_zAs$ where $y>z>x$ makes up the active region 24, for example. A layer of $p\text{-}Ga_{1-y}Al_yAs$ makes up the second cladding layer 26, while a layer of p+GaAs makes up the cap layer 28, for example.

The preferred embodiment of the present invention includes four 12-nanometer quantum wells of $Ga_{1-x}Al_xAs$, x about equal to 0.05, separated by three 6-nanometer barriers of $Ga_{1-z}Al_zAs$, z about equal to 0.20. The active region 24 has a thickness of about 66-nanometers. A first metallic film 30 and a second metallic film 32 make up a set of electrical contacts to the heterostructure 10. These films can be made from any number of materials, as is well known in the art.

Figure 2:
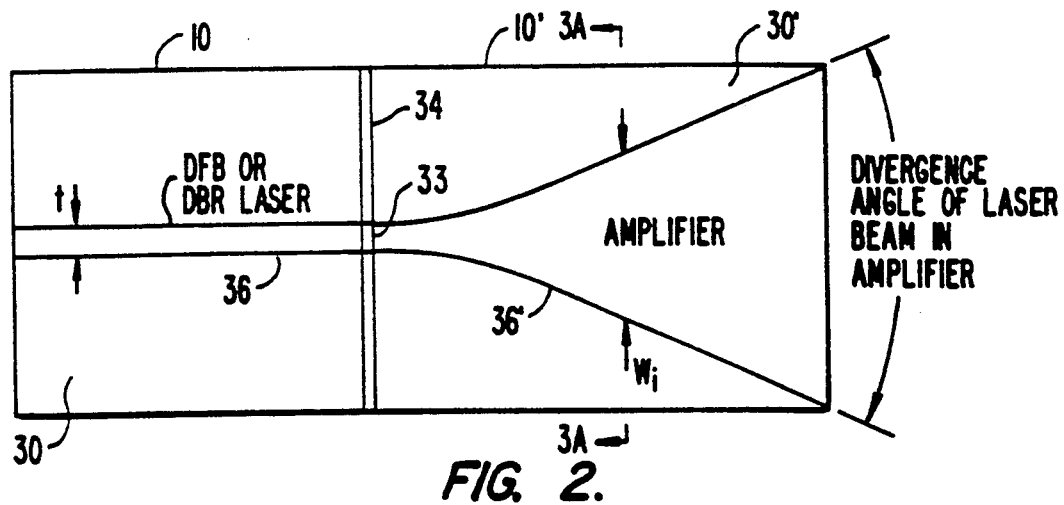
FIG. 2 is top view of a preferred embodiment of the present invention illustrating an integrated semiconductor heterostructure 10 and an integrated semiconductor amplifier part 10'.

FIG. 2 is top view of a preferred embodiment of the present invention illustrating an integrated semiconductor laser heterostructure 10 and an integrated semiconductor optical amplifier part 10'. Heterostructure 10, corresponding to a semiconductor laser part, and heterostructure 10', corresponding to an amplifier part, are integrated together and except for the differences identified below, are virtually identical. The heterostructure 10 provides a distributed feedback (DFB) or distributed Bragg reflector (DBR) laser operable by application of a particular bias voltage to the upper contact 30, as is well known in the art, to produce a population inversion of carriers in the active region 24 of the heterostructure 10. Sufficient pumping produces an output beam of coherent radiation having particular characteristics, such as modal characteristics, established by structural elements of the heterostructure 10.

Integrated with the laser part is an amplifier part having the heterostructure 10'. A boundary 33 separates the upper contact 30' of the heterostructure 10' from the upper contact 30 of the heterostructure 10. The boundary 33 allows, if desired, a second particular bias, different from the particular bias of the heterostructure 10, to control operation of the amplifier part, separate from the part. As indicated in FIG. 2, the optical waveguide 36 maintains a relatively constant width t over the length of the laser part. This provides a suitable resonance cavity for the laser part. The width of the optical waveguide 36' has a varying width $W_i$. The width $W_i$ expands to match the shape of the emitted radiation through the amplifier part. Semiconductor lasers have a relatively large divergence angle, thus the width $W_i$ varies significantly along the length of the amplifier part. The optical waveguides can be formed by layer disordering as described in U.S. Pat. No. 4,870,652 to Thornton entitled, "Monolithic High Density Arrays of Independently Addressable Semiconductor Laser Sources." Portions of the cap layer outside of waveguides 36' and 36 are made electrically resistive for example by proton bombardment as is well known in the art in order to confine the carriers to only regions 36' and 36.

Figure 3A:
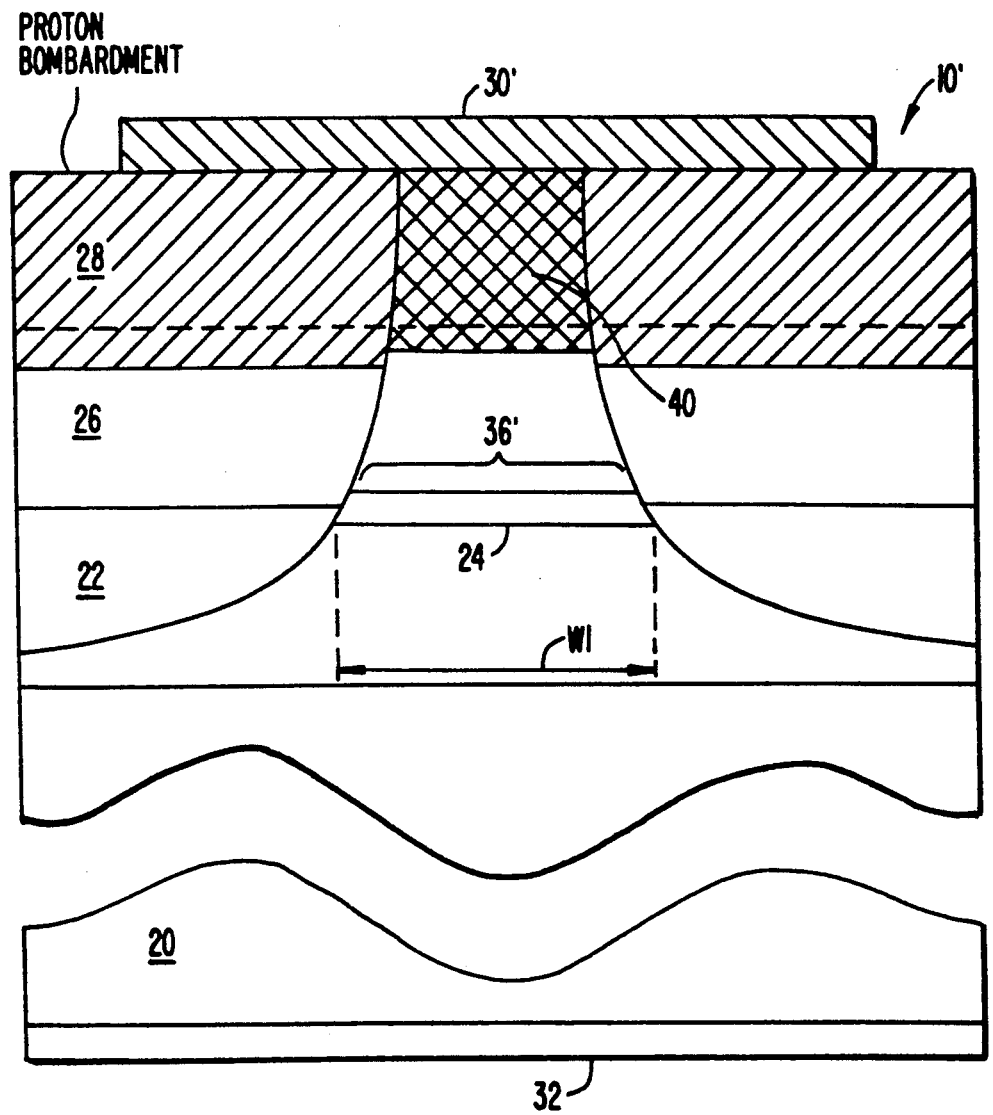
FIG. 3A is an enlarged view of a profile of the integrated semiconductor amplifier part 10' illustrating a mask layer 40 interposed between a top contact 30' of the amplifier part and the cap layer 28.

FIG. 3A is an enlarged view of a profile of the integrated semiconductor amplifier part 10' illustrating a mask layer 40 interposed between an upper contact 30' of the amplifier part and the active layer 24. A preferred embodiment is to make this pattern in cap layer 28 and a portion of the cladding layer 26 with proton bombardment to create high resistivity regions. The profile of FIG. 3A is taken at an arbitrary point along the amplifier length for a waveguide 36' width $W_i$. The purpose of the mask layer 40 is to shape a lateral gain profile of the active region 24 of the heterostructure 10' for the laser radiation as it propagates through the amplifier part. In the preferred embodiment of the present invention, an injected current through the upper contact 30' and mask layer 40 shapes the lateral gain profile to match a modal shape of the laser radiation as it expands in the amplifier part. This mask layer 40' shape takes into account the index of refraction and a gain profile of the amplifier part. The preferred embodiment of the present invention provides a smooth transition (lacking discontinuities) from the laser waveguide 36 to the amplifier waveguide 36'. Any discontinuities could lead to undesirable reflections from modal mismatch. The patterned cap layer 28 may be any number of configurations to control local current density and to vary that density across the width of the expanding laser beam.

Figure 3B:
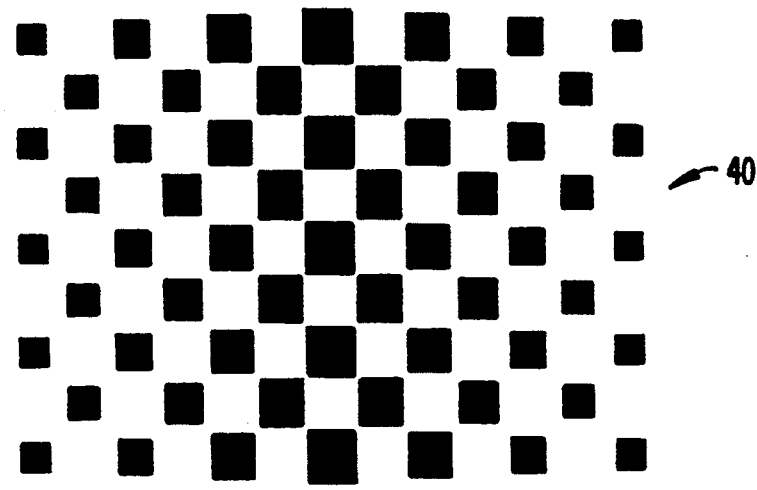
FIG. 3B is a top view figure of one preferred embodiment for the mask layer 40 using a plurality of open dots of varying size and density to control the carrier density in the active region 24 of the amplifier part.

FIG. 3B is a top view figure of one preferred embodiment for the mask layer 40 or the patterned cap layer 28 using a plurality of open dots of varying size and density to control the carrier density in the active region 24 of the amplifier part.

Etching the p+GaAs cap layer 28 with suitable reagents, such as for example, $H_2SO_4:H_2O_2:H_2O::1:8:40$, to produce a pattern similar to that of FIG. 3B provides an alternate mechanism for spatial tailoring of carriers in the amplifier section. The pattern of FIG. 3B is however, not shown shaped to match the expanding beam in the amplifier part, but is only a schematic representation of the pattern prior to the shaping required for beam expansion. The optical waveguide 36', also matching the expanding profile of the laser beam in the amplifier part, underlies this mask layer 40. In this preferred embodiment, the metal of the contact layer 30' forms an injecting ohmic contact to the cap layer 28, where the cap layer 28 has not been etched away. In those areas where the cap layer 28 has been etched away, the metal of the contact 30' forms a Schottky blocking contact to the cladding layer 26. The spatial tailoring of the gain of the active region resulting from a varying injection density increases from left to right until the midpoint of the mask layer 40, at which point it falls off again. This peak in the gain profile coincides with the amplitude maxima of the $TE_{0,0}$ wave as it propagates and expands in the amplifier part.

Figure 3C:
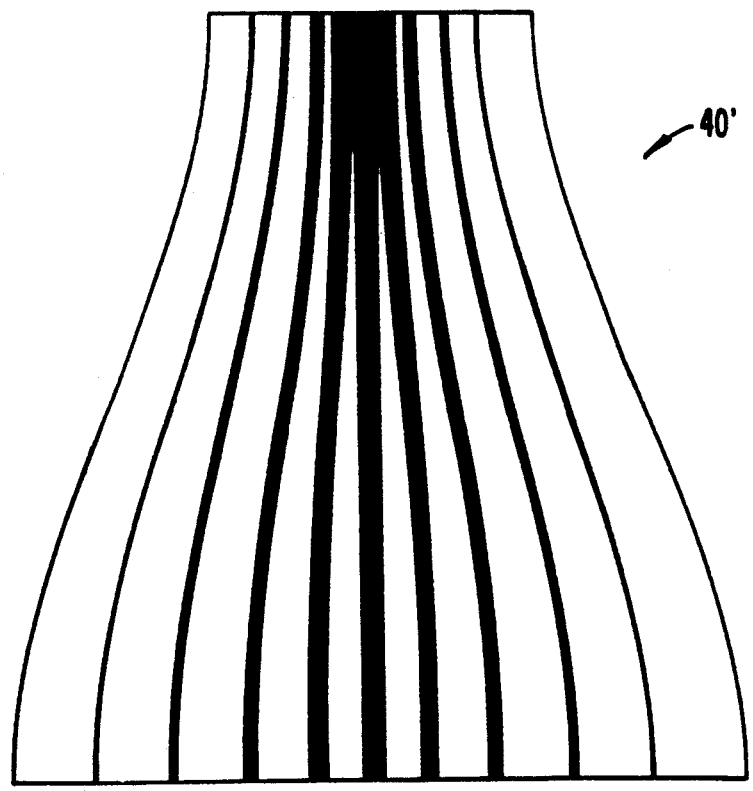
FIG. 3C is another preferred embodiment for a mask layer 40' of the present invention.

FIG. 3C is another preferred embodiment for a mask layer 40' of the present invention. Etching or proton bombarding the cap layer 28 to produce the mask layer 40' will also produce a spatially varying gain profile across the width of the amplifier part. This particular gain profile, like the profile produced by the mask layer 40 of FIG. 3B matches a fundamental mode of the laser beam as it propagates through the amplifier part. Note that in FIG. 3C, unlike FIG. 3B, the mask layer 40' is shown conforming to the profile of the expanding laser beam of the amplifier part. It is also possible to form the upper contact 30' to correspond to the patterns illustrated for the mask layers in FIG. 3B and FIG. 3C without etching the cap layer 28. A thickness of the cap layer 28, and the cladding layer 26 contributes to a smoothing of the final gain profile effected in the active region of the amplifier part. Other mask patterns are possible to control carrier density.

One example of this method was demonstrated by Lindsey, et al. in TAILORED-GAIN BROAD-AREA SEMICONDUCTOR LASER WITH SINGLE-LOBED DIFFRACTION-LIMITED FAR-FIELD PATTERN, Electronics Letters, Vol. 21, No. 16, pg. 671, (August 1985), hereby expressly incorporated by reference for all purposes.

Another preferred embodiment of the present invention would employ variably spaced and sized striped contacts running parallel to contours of the expanding mode as illustrated in FIG. 3C, for example. Other contacting patterns are possible to control carrier density.

Figure 4A:
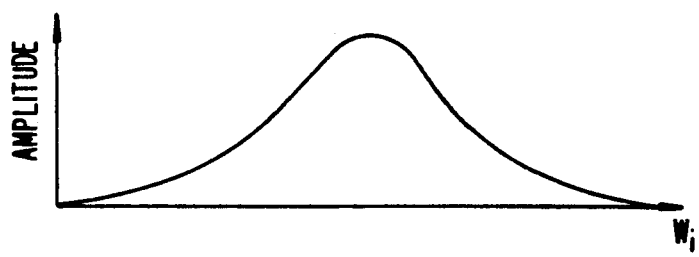
FIGS. 4A-4C are graphs illustrating particular phenomena relative to the active region 24 of the amplifier part; Specifically.
Figure 4B:
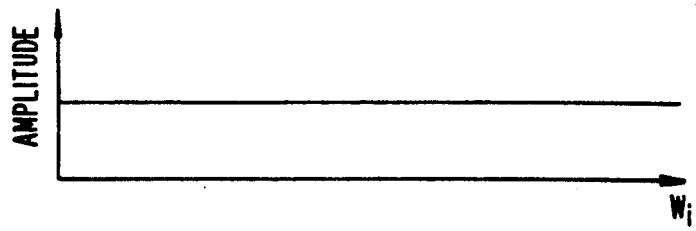
Figure 4C:
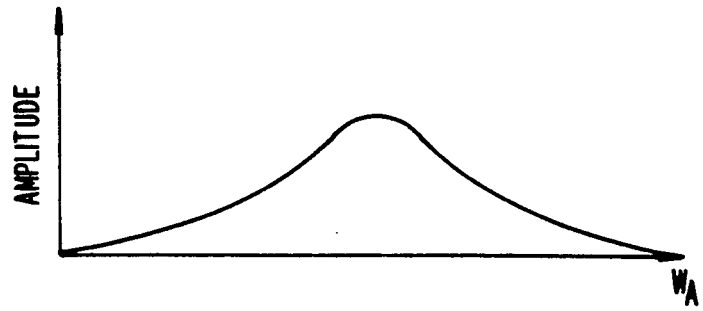

FIGS. 4A-4C are graphs illustrating particular phenomena relative to the active region 24 of the amplifier part FIG. 4A is a graph of a $TE_{0,0}$ fundamental wave emitted by the active region 24 of the heterostructure 10 showing amplitude versus spatial position at a particular cross-sectional area of the amplifier part 10' having waveguide 36' with a width $W_i$. Many uses of the semiconductor laser require emission and amplification of the $TE_{0,0}$ fundamental mode to maximize power and efficiency. This fundamental mode has an amplitude maxima in a middle of the laser beam, with amplitudes decreasing to minima at the beam edges.

FIG. 4B is a graph, corresponding to the graph of FIG. 4A, approximately illustrating a concentration of electrons or holes in the active region 24 of the amplifier part 10' under the upper contact 30' versus spatial position for an amplifier part 10' without the mask layer 40. As shown, the electron or hole density is uniform across the width of the amplifier part in the absence of lateral gain profile shaping. The concentration of the electrons or holes directly correspond to the gain because it is these carriers which recombine by stimulated emission to amplify the laser beam as it propagates through the active region 24 of the amplifier part. This particular gain profile of FIG. 4B is inefficient and leads to modal distortion of the propagating laser beam because it does not match the shape of the expanding gaussian-like mode, especially as $W_i$ increases.

FIG. 4C is a graph, corresponding to the graph of FIG. 4A, illustrating a concentration of carriers (electrons or holes) in active region 24 of the amplifier part 10' under the upper contact 30' versus a spatial position for the amplifier part 10' having the mask layer 40 according to the present invention. In FIG. 4C, the desired carrier density, which corresponds to the tailored gain profile, matches the desired mode of the laser beam, which in the preferred embodiment of the present invention, is the shape of the beam illustrated in FIG. 4A. The preferred embodiment of the present invention is not limited to tailoring to match the fundamental mode. If some other mode were desired, the amplitude maxima and minima in a lateral direction across the amplifier part could be shaped by appropriate control over the carrier density injected into particular portions of the amplifier part.

Figure 5:
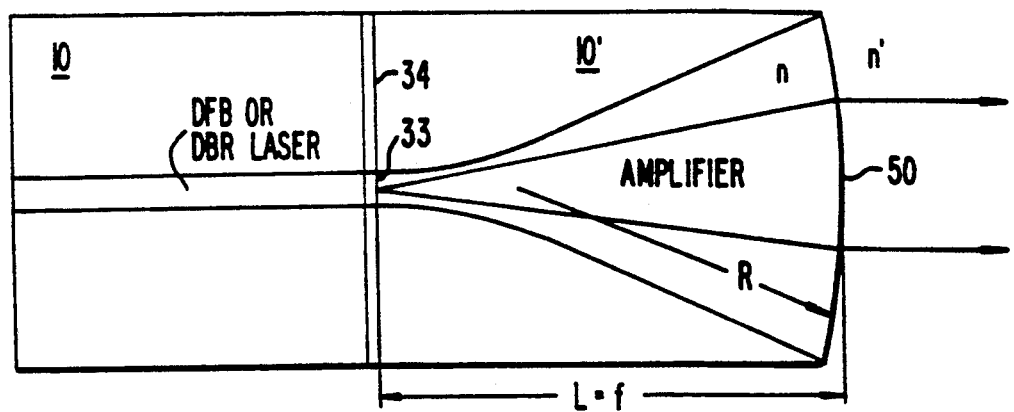
FIG. 5 is a top view of a preferred embodiment of the present invention illustrating an integrated semiconductor laser heterostructure 10 and an integrated semiconductor optical amplifier part 10' with an output lens 50 integrated with the amplifier part 10' for collimating an output beam.

FIG. 5 is a top view of a preferred embodiment of the present invention illustrating an integrated semiconductor laser heterostructure 10 and an integrated semiconductor amplifier heterostructure 10' with an output lens 50 integrated with the amplifier heterostructure 10' for collimating an output beam. Collimation of the output laser beam results from shaping an output surface of the amplifier heterostructure 10' to have a focal point f. By placement of an output plane of the laser heterostructure 10 at the focal point f (i.e. the length of the amplifier heterostructure approximately equals the focal length) collimation results. Generally speaking, providing the amplifier heterostructure 10' having an output lens with a radius of curvature R about equal to $(n-n')/n * f$, where n is the index of refraction of the amplifier heterostructure and n' is the index of refraction of the medium into which the amplifier heterostructure 10' emits the laser radiation. For example, for collimation into air from GaAs, R is about equal to 0.72 times the focal length.

Figure 6:
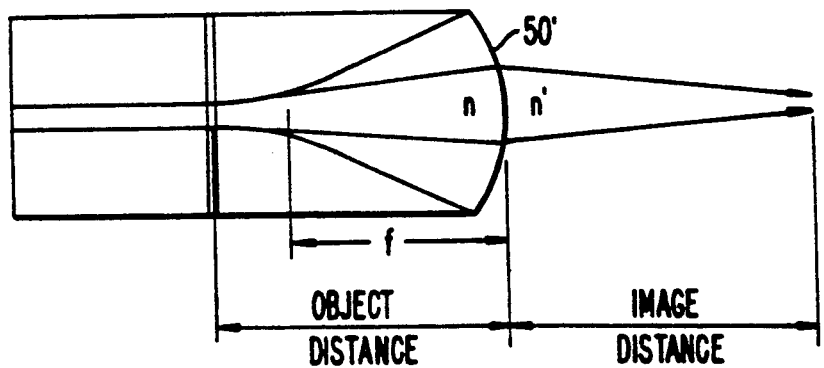
FIG. 6 is a top view of a preferred embodiment of the present invention illustrating an integrated semiconductor laser heterostructure 10 and an integrated semiconductor optical amplifier part 10' with an output lens 50' integrated with the amplifier part 10' for focussing an output beam.

FIG. 6 is top view of a preferred embodiment of the present invention illustrating an integrated semiconductor laser heterostructure 10 and an integrated semiconductor amplifier part 10' with an output lens 50' integrated with the amplifier part 10' for focusing an output beam. In FIG. 6, the output lens 50' provides a magnified image of the output laser plane at the virtual boundary 34. For example, positioning the output plane at $(n+n')*f$ focusses the output plane image as shown in FIG. 6, such that the object and image distances are equal. As the theoretical magnification is less than 1, coherent wave propagation principles should be used to calculate the spot size. For a GaAs device having a focal length about equal to 500 microns, a radius of curvature of the output lens 50' is about 360 microns. This configuration provides an image distance about equal to an object distance, both about equal to 640 microns.

Other shapes and configurations for an output lens integrated into an output of the amplifier heterostructure are possible given the advantage of the present disclosure. For the output lenses of FIG. 5 and FIG. 6, etching, by any number of well known techniques using wet chemicals, reactive ions or plasmas, will produce a desired shape for the output lens. Possible uses for the output lens with other shapes include correction for wavefront distortion from the gain medium of the amplifier heterostructure 10'. In some instances it may be desirable to reduce reflections off of the concave surface of the disclosed embodiments for the lenses of the preferred embodiments. An anti-reflective coating on the output lens will reduce these reflections.

Figure 7:
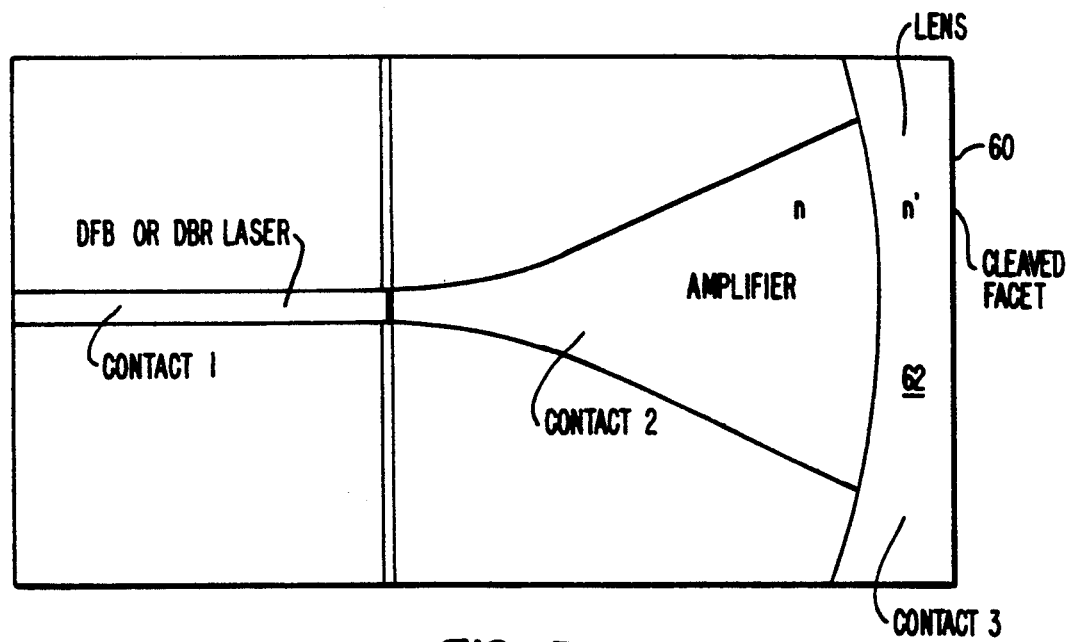
FIG. 7 is a top view of a preferred embodiment of the present invention illustrating an integrated semiconductor laser heterostructure 10 and an integrated semiconductor optical amplifier part 10' having an output lens 60 provided with a separate contact set for an electronically controllable focal length.

FIG. 7 is top view of a preferred embodiment of the present invention illustrating an integrated semiconductor laser heterostructure 10 and an integrated semiconductor amplifier part 10' having an output lens 60 provided with a separate contact set 62 for electronically controlling a focal length. The independently addressable upper contact 62 provides a mechanism to vary an index of refraction for the output lens 60. Controlling a density of carriers injected into an active region 24 of the output lens 60 varies the index of refraction. The configuration of the output lens 60, concave-plano, provides expected control over a focussing length of the output beam from about 30R to about 86R, with R being a radius of curvature of the concave length, and about equal to 300-400 microns. It may be necessary to increase the bandgap energy of the active layer 24 of the output lens 60 to avoid excessive loss in the lens caused by excitation of electrons from valence to conduction band in the semiconductor material. Impurity induced disordering after growth, as described in U.S. Pat. No. 4,802,182 to Thornton et al. entitled, "Monolithic Two Dimensional Waveguide Coupled Cavity Laser/Modulator," or in situ laser induced desorption during growth, as described in U.S. Pat. No. 4,962,057 to Epler et al., "Method of In Situ Photo Induced Evaporation Enhancement of Compound Thin Films During or After Epitaxial Growth," are examples of methods to increase the bandgap energy, if desired. The electronically controllable focal length permits dynamic correction of the image distance as well as modulation of a focal spot size. These preferred embodiments using the integrated lens are useful in printing applications, for example. The particular configurations illustrated for the lenses in FIG. 5 through FIG. 7 are representative of preferred embodiments, but design of other shapes for other effects is possible while still incorporating the present invention. Other designs can provide increased control of an image distance, or spot size, or both, for example.

In conclusion, the present invention provides improved amplification efficiency without introducing modal distortions. While the above is a complete description of the preferred embodiments of the invention, it is possible to use various alternatives, modifications, and equivalents, in addition to those discussed previously.

What is claimed is:

1. A method for controlling a divergence of coherent radiation emitted by a semiconductor structure having a laser part and an optical part, said laser and optical parts having a plurality of semiconductor heterostructures layers disposed over a substrate, at least one of said layers of each said part being an active region for light amplification and propagation under lasing conditions, comprising the steps of:

integrating the laser part and the optical part into a monolithic structure;

applying an electrical forward bias to the layers in said laser part to promote said laser part to emit a laser beam having a particular mode; and effecting a spatially varying index profile of the optical part to match a modal shape of said particular mode of said laser beam during expansion in the optical part.

2. The method of claim 1 wherein said optical part is an amplifier part having a spatially varying gain profile to match a modal shape of said particular mode of said laser beam during expansion in the optical part.

3. The method of claim 1 wherein said optical part is a transparent waveguide section.

4. The method of claim 1 further comprises a step of collimating said laser beam by shaping an output surface of the optical part.

5. The method of claim 1 further comprising a step of converging said laser beam by shaping an output surface of the optical part.

6. The method of claim 1 further comprising a step of diverging said laser beam by shaping an output surface of the optical part.

7. A method for controlling a divergence of coherent radiation emitted by a semiconductor laser having a plurality of semiconductor heterostructures layers disposed over a substrate, at least one of the layers being an active region for light amplification and propagation under lasing conditions, comprising the steps of:

integrating an optical part with the laser part on a monolithic structure with an output of the laser part provided to an input of said optical part;

applying an electrical forward bias to the layers in the laser part promoting the laser part to emit a laser beam having a particular mode;

expanding the laser beam in the optical part having a spatially varying index profile of the optical part to match a modal shape of said particular mode of said laser beam during expansion in the optical part; and modifying a wavefront of the laser beam by shaping an output surface of said optical part.

8. The method of claim 7 wherein said optical part is an amplifier part having a spatially varying gain profile to match a modal shape of said particular mode of said laser beam during expansion in the optical part.

9. A method for dynamically controlling a divergence of coherent radiation emitted by a semiconductor laser having a plurality of semiconductor heterostructures layers disposed over a substrate, at least one of the layers being an active region for light amplification and propagation under lasing conditions, comprising the steps of:

integrating an optical part and a lens part with the laser part on a monolithic structure with an output of the laser part provided to an input of said optical part and an output of said optical part provided to said lens part;

applying an electrical forward bias to the layers in the laser part promoting the laser part to emit a laser beam having a particular mode;

expanding the laser beam in the optical part having a spatially varying index profile of the optical part to match a modal shape of said particular mode of said laser beam during expansion in the optical part; and modifying a wavefront divergence of the laser beam output from said lens part by controlling dynamically a refractive index of said lens part.

10. The method of claim 9 wherein said optical part is an amplifier part having a spatially varying gain profile to match a modal shape of said particular mode of said laser beam during expansion in the optical part.

11. The method of claim 9 wherein said lens part is controlled independent of said optical part.

12. A method for shaping a grain profile in a semiconductor optical amplifier integrated with a laser part, the method comprising a step of:

effecting a spatially varying gain profile of the amplifier by an injected current such that said spatially varying gain profile matches an intensity profile of an expanding mode in the amplifier.

13. The gain profile shaping method of claim 12 wherein said effecting step includes the step of shaping a size and density of windows in a mask layer through which said current is injected into the amplifier to effect the spatial distribution of said gain profile.

14. A monolithic semiconductor structure, comprising:

a laser part and an amplifier part, said laser and amplifier parts having a plurality of semiconductor heterostructures layers disposed over a substrate, at least one of said layers of each said part being an active region for light amplification and propagation under lasing conditions;

means, electrically coupled only to said laser part, for applying an electrical forward bias to said layers in said laser part causing said laser part to emit radiation having a particular mode; and means, electrically coupled only to said amplifier part, for effecting a spatially varying gain profile of said amplifier part to match a modal shape of said particular mode of said laser part during expansion in said amplifier part.

15. The semiconductor structure of claim 14 wherein said amplifier part includes an optical waveguide for variably controlling the modal shape during expansion in said amplifier part.

16. The semiconductor structure of claim 14 wherein said particular mode is a $TE_{0,0}$ wave.

17. The semiconductor structure of claim 14 wherein said effecting means includes a contact to said amplifier part having a plurality of open dots having a size and density variation to variably control local current across said amplifier part.

18. The semiconductor structure of claim 14 wherein said effecting means includes a contact to said amplifier part having a plurality of stripes running parallel to selected contours of said particular mode as it expands in said amplifier part, said plurality of stripes having a width and spacing variation to variably control local current across said amplifier part.

19. A monolithic semiconductor structure, comprising:

a laser part and an amplifier part, said laser and amplifier parts having a plurality of semiconductor heterostructures layers disposed over a substrate, at least one of said layers of each said part being an active region for light amplification and propagation under lasing conditions, with said amplifier part integrating a lens part at an output of said amplifier part;

means, electrically coupled only to said laser part, for applying an electrical forward bias to said layers in said laser part causing said laser part to emit radiation having a particular mode; and means, electrically coupled only to said amplifier part, for effecting a spatially varying gain profile of said amplifier part to match a modal shape of said particular mode of said laser part during expansion in said amplifier part.

20. The semiconductor structure of claim 19 wherein said amplifier part includes an optical waveguide for variably ontrolling the modal shape during expansion in said amplifier part.

21. The semiconductor structure of claim 19 wherein said lens part has a focal length equal to length of said amplifier part to collimate radiation emitted from said amplifier part output.

22. The semiconductor laser of claim 19 wherein said lens part has a focal length less than length of said amplifier part to focus radiation emitted from said amplifier part output.

23. The semiconductor laser of claim 19 wherein said lens part has a focal length greater than length of said amplifier part to disperse radiation emitted from said amplifier part output.

24. A monolithic semiconductor structure, comprising:

a laser part and an amplifier part, said laser and amplifier parts having a plurality of semiconductor heterostructures layers disposed over a substrate, at least one of said layers of each said part being an active region for light amplification and propagation under lasing conditions, with said amplifier part integrating a lens part at an output of said amplifier part;

means, electrically coupled only to said laser part, for applying an electrical forward bias to said layers in said laser part causing said laser part to emit radiation having a particular mode;

means, electrically coupled only to said amplifier part, for effecting a spatially varying gain profile of said amplifier part to match a modal shape of said particular mode of said laser part during expansion in said amplifier part; and means, electrically coupled only to said lens part, for controlling a focal point of said lens part by dynamically varying an index of refraction of said lens part.

25. The semiconductor structure of claim 24 wherein said amplifier part includes an optical waveguide for variably controlling the modal shape during expansion in said amplifier part.

26. A monolithic semiconductor structure, comprising:
- a laser part and an amplifier part, said laser and amplifier parts having a plurality of semiconductor heterostructures layers disposed over a substrate, at least one of said layers of each said part being an active region for light amplification and propagation under lasing conditions to produce an electromagnetic wave having a particular mode characterized by spatially distributed amplitude maxima and minima;
- a first contact set, electrically coupled only to a first and a second surface of said laser part, for receiving a first voltage and applying a first electrical forward bias to said layers in said laser part causing said laser part to emit said electromagnetic wave having said particular mode;
- a second contact set, electrically coupled only to a first and second surface of said amplifier part, for receiving a second voltage and applying a second electrical forward bias to said layers of said amplifier part causing said active region of said amplifier part to produce a population inversion of a plurality of carriers which amplify said electromagnetic wave as it expands during propagation through said active region; and
- a mask, disposed between one contact of said second contact set and said active region of said amplifier part, for tailoring a spatial gain profile of said active region of said amplifier part to provide a non-uniform spatial distribution of said plurality of carriers in said active region, with said plurality of carriers having variable densities, with highest densities of said plurality of carriers in said active region corresponding to said amplitude maxima of said particular mode of said electromagnetic wave and lowest densities of said plurality of carriers corresponding to said amplitude minima of said particular mode of said electromagnetic wave.

27. A method for amplifying coherent radiation, comprising the steps of:
- integrating an amplifier part with a laser part on a single monolithic structure having a plurality of semiconductor heterostructure layers wherein at least one of said layers is an active region for light amplification and propagation under lasing conditions to produce an electromagnetic wave having a particular mode characterized by spatially distributed amplitude maxima and minima (caused by optical waveguide in laser) and amplified by a particular profile of gain in said active region of said amplifier; and
- said active region of said amplifier controlling said particular profile of said gain by controlling a carrier density profile to correspond to said particular mode.

28. A semiconductor laser amplifier for operation with a semiconductor laser including a monolithic semiconductor structure having a plurality of semiconductor heterostructure layers disposed over a substrate, at least one of said layers being an active region for light amplification and propagation under lasing conditions to produce an electromagnetic wave having a particular mode characterized by spatially distributed amplitude maxima and minima, comprising:
- an amplifier part integrated with the semiconductor laser with said amplifier part including a plurality of semiconductor heterostructure layers disposed over a substrate, at least one of said layers being an active region for light amplification and propagation under lasing conditions; and
- a lens part integrated into an output of said amplifier part.

29. A monolithic semiconductor structure, comprising:
- a laser part and an amplifier part, said laser and amplifier parts having a plurality of semiconductor heterostructure layers disposed over a substrate, at least one of said layers of each said part being an active region for light amplification and propagation under lasing conditions;
- an electrical contact, coupled to said amplifier part, for receiving an electromotive force and inducing an electrical forward bias in said layers of said amplifier part independent of bias of said laser part, causing said amplifier part to amplify a laser beam received from said laser part; and
- a mask layer, interactive with said active region of said amplifier part and responsive to said electromotive force, for shaping a gain profile of said amplifier part active region to approximate the intensity profile of a particular mode of said laser beam by producing a varying density of carriers in said active region, with said density being greatest in regions corresponding to amplitude maxima of said particular mode and said density being least in regions corresponding to amplitude minima of said particular mode.

* * * * *